(12) United States Patent
Kyogoku

(10) Patent No.: US 8,724,082 B2
(45) Date of Patent: May 13, 2014

(54) SEMICONDUCTOR LASER DRIVER AND IMAGE FORMING APPARATUS INCORPORATING SAME

(75) Inventor: Hiroaki Kyogoku, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 524 days.

(21) Appl. No.: 13/040,535

(22) Filed: Mar. 4, 2011

(65) Prior Publication Data

US 2011/0216295 A1 Sep. 8, 2011

(30) Foreign Application Priority Data

Mar. 4, 2010 (JP) ................................. 2010-048154

(51) Int. Cl.
 *G03B 27/42* (2006.01)
(52) U.S. Cl.
 USPC ................. 355/53; 355/63; 355/67; 355/77; 359/627; 359/237; 359/731; 359/859; 359/838; 359/850; 359/216.1; 359/857; 359/352; 359/851; 359/872; 359/865; 359/855; 372/38.01; 372/38.02; 372/38.07
(58) Field of Classification Search
 USPC .......... 355/53, 63, 67, 77; 359/627, 237, 731, 359/859, 838, 850, 216.1, 857, 352, 851, 359/872, 865, 855; 372/38.01, 38.02, 38.07
 See application file for complete search history.

(56) References Cited

U.S. PATENT DOCUMENTS

| | | | |
|---|---|---|---|
| 6,842,500 B1 * | 1/2005 | Komatsuda et al. ............ | 378/34 |
| 7,301,976 B2 | 11/2007 | Ikeda et al. | |
| 7,359,414 B2 | 4/2008 | Ikeda et al. | |
| 7,480,320 B2 | 1/2009 | Kyougoku | |
| 7,573,922 B2 | 8/2009 | Kamatani et al. | |
| 7,653,101 B2 | 1/2010 | Ikeda et al. | |
| 7,693,196 B2 | 4/2010 | Kamatani et al. | |
| 7,729,399 B2 | 6/2010 | Kyogoku | |
| 2006/0285564 A1 * | 12/2006 | Kyogoku ................... | 372/38.07 |

FOREIGN PATENT DOCUMENTS

| | | |
|---|---|---|
| JP | 2005-064001 | 3/2005 |
| JP | 3880914 | 11/2006 |
| JP | 2006-0351945 | 12/2006 |
| JP | 2007-73543 | 3/2007 |
| JP | 4082956 | 2/2008 |

(Continued)

OTHER PUBLICATIONS

Japanese official action dated Nov. 26, 2013 in corresponding Japanese patent application No. 2010-48154.

*Primary Examiner* — Steven H Whitesell Gordon
*Assistant Examiner* — Mesfin T Asfaw
(74) *Attorney, Agent, or Firm* — Cooper & Dunham LLP

(57) ABSTRACT

A semiconductor laser driver includes a light detection circuit to detect a quantity of light as a detected light emission intensity and output the detected light emission intensity to the control circuit, and a control circuit to control a light emission intensity for the semiconductor laser based on the detected light emission intensity and on a predetermined light emission intensity setting value. The light detection circuit includes a photoelectric conversion element to convert the quantity of light emitted from the semiconductor laser into an electrical current and output the converted electrical current, a current magnification setting circuit to amplify the electrical current output from the photoelectric conversion element to a predetermined amplified current at one of multiple different predetermined magnifications, a detection resistor to convert the amplified current output from the current magnification setting circuit into a voltage and output the voltage as the detected light emission intensity.

8 Claims, 8 Drawing Sheets

(56) References Cited

FOREIGN PATENT DOCUMENTS

| | | |
|---|---|---|
| JP | 4108321 | 4/2008 |
| JP | 4125582 | 5/2008 |
| JP | 4146711 | 6/2008 |
| JP | 2008-227129 | 9/2008 |
| JP | 4213945 | 11/2008 |
| JP | 4312573 | 5/2009 |
| JP | 4427277 | 12/2009 |
| JP | 4471597 | 3/2010 |
| JP | 4570862 | 8/2010 |

\* cited by examiner

COMPARATIVE EXAMPLE

US 8,724,082 B2

SEMICONDUCTOR LASER DRIVER AND IMAGE FORMING APPARATUS INCORPORATING SAME

TECHNICAL FIELD

The present disclosure relates to a semiconductor laser driver, and an image forming apparatus including the semiconductor laser driver.

BACKGROUND ART

Recently, semiconductor laser diodes have come to be widely used in a variety of types of electrical equipment, for example, laser printers, optical disk apparatuses, fiber-optic communication apparatuses, and mobile phones, because of their compact size, low cost, and ease of use.

However, the current/light-emission intensity characteristics of the semiconductor laser diode are dependent on temperature. Accordingly, it is necessary to control light-emission intensity to obtain a predetermined light-emission intensity reliably. This light-emission intensity control is called Automatic Power Control (APC). In the APC process, before the semiconductor laser diode is actually driven, the laser diode is driven in advance, quantity of light output from the laser diode is received by a photo diode (PD), and the detection current values of corresponding quantities of light are stored in a storage device. Then, the laser diode is controlled using the current values saved in the storage device so as to obtain a desired light-emission intensity reliably.

High resolution and high-speed operation are required of contemporary printers and copiers, including those that employ a semiconductor laser as a light source. In a case in which there is only a single laser beam used, in order to improve image resolution and printing speed it is necessary to increase modulation speed, which is the speed at which the semiconductor laser is driven (turned on and off) in accordance with the input image data. However, there is a limit to the modulation speed. Accordingly, in order to improve image resolution and operating speed without increasing the modulation speed, there is no alternative but to increase the number of laser beams.

In a case in which four laser beams are used, when it is assumed that the modulation speed and the printing speed are to the same as in a case in which a single beam is set in the laser light, the image resolution in the main-scanning direction and sub-scanning direction (horizontal and vertical directions) can be doubled. Alternately, in this case, when the image resolution is to the same as a case in which a single beam is set in the laser light, the printing speed can be quadrupled.

As for the semiconductor laser used for the light source, edge-emitting laser elements (hereinafter "edge-emitting lasers") that emit laser light parallel to the activation layer are widely used. When the edge-emitting laser is used, the number of beams is set a single laser beam, or two or four multi-beam lasers is used in the printers and copiers. Since an optical axis between the lasers of the multi-beam laser is stable, when the multiple beams are required, it facilitates adjustment of the optical axis between the adjacent lasers by using the multi-beam laser rather than by adjusting multiple individual single lasers in the apparatus separately.

Generally, a laser unit of the edge-emitting laser includes a single photo-receiver element in addition to a multi-beam laser. The edge-emitting laser emits backward (back projection) proportional to a front projecting power as used as the laser light, and the photo-receiver element PD installed in the laser unit receives the back projection and generates a monitor current similarly proportional to the quantity of the light received. In the multi-beam laser, even when the powers of front projection for respective laser diodes are identical, the monitor currents thus generated are slightly different among the beams due to individual variability.

FIG. 1 illustrates a schematic diagram of a related art semiconductor laser driver 7 and control processes thereof. In this example, the semiconductor laser LD is constructed of multi-beam laser capable of outputting two beams from two laser diodes LD1 and LD2. The semiconductor laser driver 7 includes a semiconductor laser LD (multi-beam laser) emitting two laser beams, a light detection circuit 703 that detects the light-emission intensity from the semiconductor laser LD (LD1 and LD2), and the light-quantity control circuit 705 that controls light-emission intensities (quantity of light) of the laser diodes LD1 and LD2. The light detection circuit 703 includes a photoelectric conversion element (photodiode) PD, two variable resistors VR1 and VR2, and switches SW71 and SW72. The photo-receiver element PD functions as a photoelectric conversion element that converts the light-emission intensity outputted from the laser diodes LD1 and LD2 into electrical currents and outputs the converted currents as monitor current Im1 and Im2. The variable resistors VR1 and VR2 convert the monitor current Im input from the photo-receiver element PD into a voltage and output the converted voltage as a detection value Vdet of the light-emission intensity. The switches SW71 and SW72 connect and disconnect either of the variable resistor VR1 and VR2 corresponding to the laser diodes LD1 and LD2 to be adjusted.

Thus, the semiconductor laser driver 7 detects a detection voltage Vdet for the light-emission intensity Po of the laser diodes LD1 and LD2 by detecting the monitor currents Im1 and Im2 from the photo-receiver element PD that are almost proportional to the corresponding light-emission intensities of the laser diodes LD1 and LD2 by converting the monitor current Im by the variable resistors VR1 and VR2. Then, the semiconductor laser driver 7 controls the light-emission intensity Po so that the detection voltage Vdet of the light-emission intensity Po is set to a predetermined voltage based on a setting value Lset of light emission intensity.

In the adjustment of the light-emission intensity, while detecting a laser power indicating in a power meter 702 under APC by viewing (visual confirmation), an operator adjusts the resistance values Rvr of the variable resistors VR1 and VR2 such that the laser power is set to a predetermined laser power.

FIG. 2 is a diagram illustrating a light-current curve between a current-light feature of light-emission intensity Po of the semiconductor laser and a light-current feature of the monitor current Im of the semiconductor laser.

As shown in FIG. 2, the monitor current Im generated in the photo-deceiver element is almost proportional to the light-emission intensity Po. The detection voltage Vdet of the light-emission intensity is calculated by multiplying the monitor current Im by resistance values Rvr of the variable resistors VR1 and VR2 (Vset=Im×Rvr).

When the resistance value Rvr of the variable resistors VR1 and VR2 are decreased, the detection voltage Vdet of the light emission intensity is decreased, the light-emission intensity Po of the semiconductor laser LD is increased so as to increase (return) to the predetermined voltage to the detection voltage Vdet of the light emission, which increases the monitor current Im. That is, as the resistance values Rvr of the variable resistors VR1 and VR2 are decreased, the monitor current Im is controlled so that the light-emission intensity is increased. Conversely, as the resistance values Rvr of the variable resistors VR1 and VR2 are increased, the monitor current Im is controlled so that the light-emission intensity Po is decreased. With these adjusting processes, when the emission powers of the front projection of the beams from the laser diodes LD1 and LD2 in the multi-beam semiconductor laser LD are equal, respectively, the generated values of the monitor current Im are slightly different among the beams. In addition, even when the output powers of the quantities of light output from the respective laser beams are equal, emitting powers for photoreceptors in an image forming apparatus are different due to difference of transmissivity and reflectance of a lens constructing the laser unit of the semiconductor laser LD. That is, in order to set lighting power on the respective photoreceptors to be equal thereamong, it is required that the light-emission intensities of the respective laser beams are set separately.

Similarly, in a multicolor image forming apparatus, the receptive colors on the photoreceptors are assigned to multiple laser beams generated in the multi-beam laser LD, and powers for requiring the colors on the photoreceptor are set separately.

In this configuration, by setting respective variable resistors VR1 and VR2 under the state in which the setting value Lset of the light-emission intensity are set separately, a desired light-emission intensity can be attained.

Herein, the setting accuracy of the variable resistors is directly reflected to the adjustment accuracy of the light emission intensities. When the setting error of the variable resistors is 1%, the setting error of the light-emission intensity becomes 1%. Thus, since the resistance value Rvr is adjusted manually, the adjustment fluctuation occurs due to the error from the operator, which causes the quality of the light-emission intensity of the semiconductor laser LD to be degraded.

Further, although a rotation shaft of the variable resistor VR1 and VR2 are fixed by a resin to keep the resistance value Rvr after the resistance value Rvr thereof is manually adjusted, the rotation shaft may be moved in the market with time and vibration, which causes to change the resistance value Rvr thereof. Accordingly, the setting error of the light amount occurs, which causes the quality of the light-emission intensity of the semiconductor laser LD to be degraded. In JP-2008-227129-A proposes an adjusting method to adjust the resistance value Rvr not manually but using electrically controlling by controlling the multiple resistors to turn multiple analog switches on and off. In this example, the multiple resistors are discrete elements, and the analog switches and a control circuit for the analog switches are integrated onto a single chip (integrate circuit IC), the same number of terminals are required in the IC side corresponding to the number of the resistors. This resistor is required at least eight because at least 8 bit resolutions are required to fine-trim the resistance value. However, this configuration is not realistic in view of the number of the required terminals in IC. In addition, the ON-resistance of the analog switches cannot go ignored compared with outside resistance values.

In a configuration in which the resistor is integrated onto the single IC, the temperature fluctuation of the resistor becomes a problem. That is, the resistor is provided for compensating the temperature fluctuation of the light-emission intensity. When the temperature fluctuation of the monitor current corresponding to the quantity of light received from the photo-receiver element PD is set to zero and the temperature is changed by 50° C., in order to restrain the fluctuation of the light-emission intensity within 1%, it is necessary to keep the fluctuation of the light-emission intensity within 100 ppm/° C. (0.5%/50° C.=100 ppm/° C.). In the manufacture of the semiconductor laser driver, it is very difficult for normal active element formation processing to produce a resistor whose temperature fluctuation is within 100 ppm/° C. If special processing is added, the target tolerance can be achieved but at the cost of a manufacturing cost increase.

SUMMARY

This patent specification describes a novel semiconductor driver. In as aspect of this disclosure, there is provided a semiconductor laser driver to drive at least one semiconductor laser, including a control circuit and a light detection circuit. The control circuit controls a light emission intensity for the semiconductor laser based on a detected light emission intensity and on a predetermined light emission intensity setting value. The light detection circuit detects a quantity of light emitted from the semiconductor laser as a detected light emission intensity and output the detected light emission intensity to the control circuit. The light detection circuit includes a photoelectric conversion element to convert the quantity of light emitted from the semiconductor laser into an electrical current and output the converted electrical current as a monitor current, a current magnification setting circuit to amplify the monitor current output from the photoelectric conversion element to a predetermined amplified current at a one of multiple different predetermined magnifications, a detection resistor to convert the amplified current output from the current magnification setting circuit into a voltage and output the voltage as the detected light emission intensity.

Additional aspects, there is provided an image forming apparatus including at least one semiconductor laser to emit light, an image control unit to generate image data and an automatic power control signal to obtain a predetermined light emission intensity of light for the semiconductor laser, and the above-described semiconductor laser driver to receive the image data and the automatic power control signal output from the image control unit.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
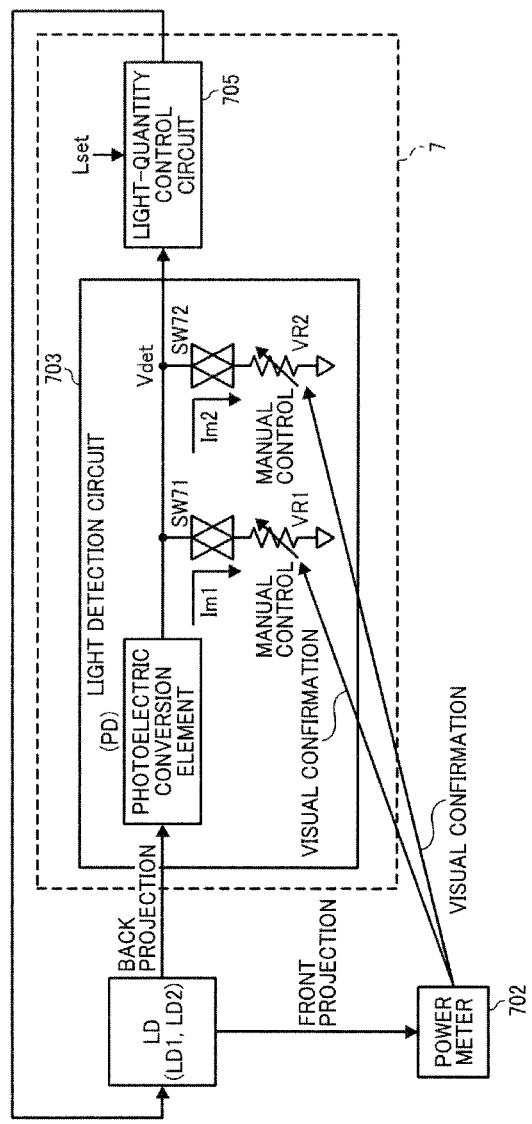
FIG. 1 illustrates a schematic diagram of a related art semiconductor laser driver and control processes thereof.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 4:
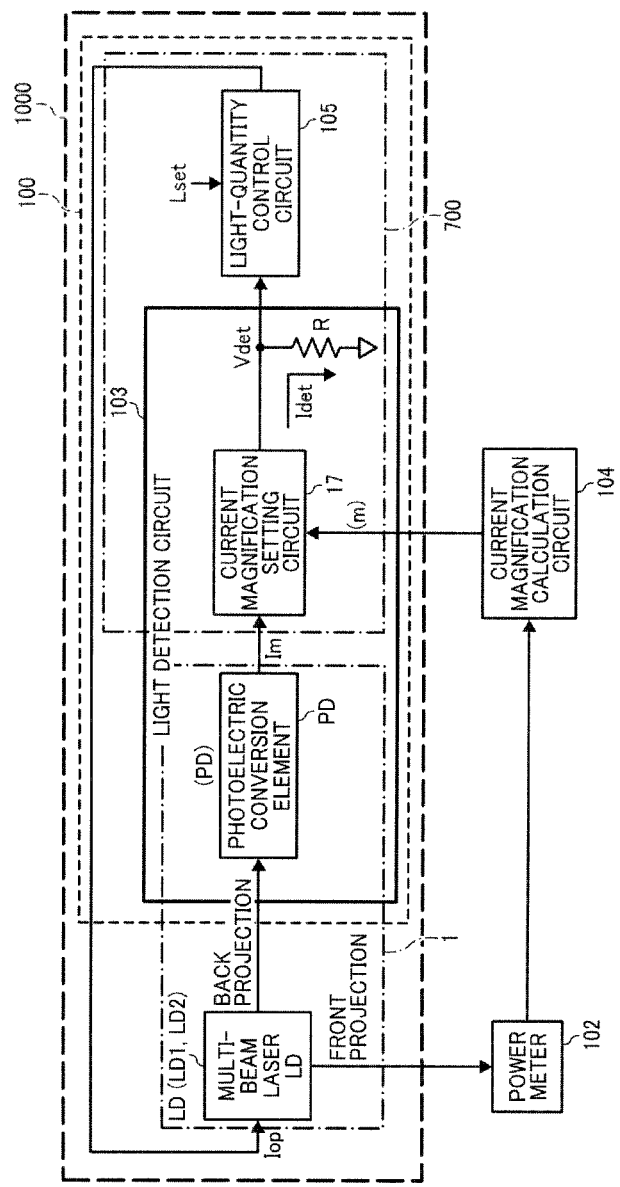
FIG. 4 is a schematic diagram illustrating the laser driver and the laser unit shown in FIG. 3, and control processes thereof.

Referring now to the drawings, wherein like reference numerals designate identical or corresponding parts throughout the several views, particularly to FIG. 4, a semiconductor laser driver 100 according to an illustrative embodiment is described.

Figure 3:
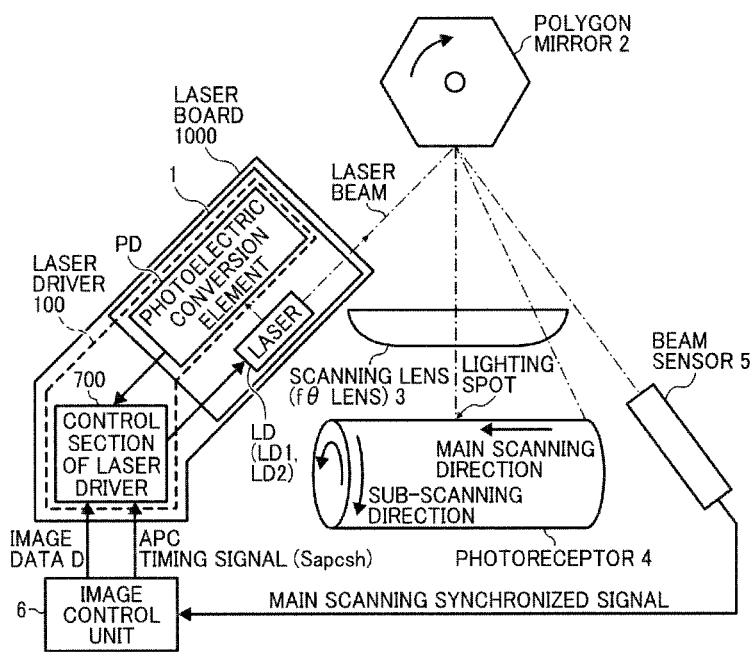
FIG. 3 is a pattern diagram of an image forming apparatus including a semiconductor laser driver according to a first illustrative embodiment.

FIG. 3 is a pattern diagram of an image forming apparatus 200. As illustrated in FIG. 3, the image forming apparatus 200 maybe a copier, a facsimile machine, a printer, a multifunction printer using electrophotographic process used in a copier, a facsimile machine, a printer, a multifunction printer having at least one of copying, printing, scanning, plotter, and facsimile functions, or the like.

In FIG. 3, the image forming apparatus 200 includes a semiconductor laser unit 1 (edge-emitting laser) 1, a polygon mirror 2, a scanning lens 3, a photoreceptor 4, a beam sensor 5, an image control unit 6, and the semiconductor laser drier (hereinafter "laser driver") 100. The semiconductor laser unit 1 and the laser driver 100 are integrated onto a same laser board.

In an image forming process, a semiconductor laser diode LD of the edge-emitting laser functioning as a light source in the semiconductor laser unit 1 emits two laser beams, and the laser beams are scanned (deflected scanned) by the polygon mirror 2 that rotates at a predetermined velocity. Then, the each lased beam forms a lighting spot on the photoreceptor 4 (scanned medium) via the scanning lens 3 (fθ lens).

The deflected laser beam scans and exposes in a main scanning direction orthogonal to a sub-scanning direction in which the photoreceptor 4 rotates, and then, image signals are recorded with respect to each line thereof.

The beam sensor 5 is disposed in a position at which the laser beam is irradiated, that is, a position close to the one end of the photoreceptor 4, to generate a main scanning synchronized signal. The image control unit 6 generates image data D and automatic power control (APC) timing signal Sapcsh synchronized with the main scanning synchronized signal from the laser beam sensor 5. The laser driver 100 controls power of emission of the semiconductor laser LD based on the APC timing signal Sapcsh, and the emission of the semiconductor laser LD, synchronized with the image data D.

While the laser driver 100 controls the emitting time of the semiconductor laser LD based on the APC timing signal Sapcsh generated in the image control unit 6, the laser LD repeats scanning the image data D on the photoreceptor 4 in the main scanning direction at a predetermined cycle in accordance with a rotation velocity and a recording density, which can form the image (latent image) on a surface of the photoreceptor 4.

In the electrophotographic process using multi-beam-laser, due to difference of transmissivity and reflectance of the lenses constructing the laser unit 1, lighting powers on the photoreceptor 4 are different even when the quantities of light (emitting amount) of the respective laser beams are identical. That is, in order to set the respective lighting powers on the photoreceptor 4, it is required for the emitting amounts of the respective laser beams are set separately.

Similarly, in a multicolor image forming apparatus, the receptive colors on the photoreceptors are assigned to multiple laser beams generated in the multiple lasers, and it is required for powers of the light-emission intensities (the emitting amount) for the respective laser beams for corresponding colors on the photoreceptor 4 to set separately.

Next, the laser driver 100 according to a feature of the present aspect is described below.

FIG. 4 is a schematic diagram illustrating the laser driver 100, and the laser unit 1 according to a present embodiment, and control processes thereof. In the laser driver 100 shown in FIG. 4, as semiconductor laser diodes, multi-laser diodes that can output two beams, that is, two semiconductor laser diodes LD1 and LD2 (hereinafter "laser diodes LD1 and LD2" or collectively "laser diodes LD") are formed in the multi-beam laser assembly. In. FIG. 4, the laser driver 100 includes the multi-laser assembly including the laser diodes LD1 and LD2, a light detection circuit 103, and a light-quantity control circuit 105. The light detection circuit 103 detects the quantities of light from the laser diodes LD1 and LD2 as light-emission intensities. The light-quantity control circuit 105, serving as a control unit, controls the light-emission intensity of the laser diodes LD1 and LD2 based on a detected light emission intensity (that is, a detection voltage Vdet) output from the light detection circuit 103 and a setting value Lset of the light-emission intensity. The setting value Lset of the light emission functions as a predetermined light emission intensity setting value.

In the laser driver 100, the light detection circuit 103 includes a photo-receiver element (photodiode) PD, a current-magnification setting circuit 17, and a detection resistor R. The photo-receiver element PD functions as a photoelectric conversion element that converts the quantity of light emitted from one of the laser diodes LD1 and LD2 into an electrical current and outputs the converted current as a monitor current Im. The current-magnification setting circuit 17 amplifies the monitor current Im at a predetermined magnification and outputs a predetermined current as a detection current Idet. The detection resistor R, converts the detection current Idet output from the current-magnification setting circuit 17 into a voltage and outputs the converted voltage as a detection value Vdet of the light-emission intensity, the a detection value Vdet functions as a detected light emission intensity of light emitted from the semiconductor laser LD. The current-magnification setting circuit 17 can set one of multiple selectable predetermined magnifications as the predetermined magnification. That is, the current-magnification setting circuit 17 amplifies the monitor current Idet output from the photoelectric conversion element PD to the predetermined current as the detection current Idet at one of the multiple different predetermined magnifications.

The semiconductor laser LD including laser diodes LD1 and LD2 emits laser beams in two directions, that is, it emits backward (back projection) and emits frontward (front projection). The intensity of the laser beam emitted frontward from the semiconductor laser LD including laser diodes LD1 and LD2 is detected by a power meter 102. Then, a current-magnification calculation circuit 104 calculates multiple magnifications to be set in the current-magnification setting circuit 17 based on the light-emission intensity detected by the power meter 102. More specifically, the current-magnification calculation circuit 104 compares the light-emission intensity detected by the power meter 102 and a reference light-emission intensity that is set in advance, and calculates how many times the detected light-emission intensity is as large as the standard light-emission intensity. Then, the current-magnification calculation circuit 104 multiplies this calculated multiplier by the magnifications set in the current-magnification setting circuit 17, and outputs the multiplied value as a current magnification (m) to be executed. Thus, by setting a new current magnification, the light-emission intensity of the semiconductor laser LD including laser diodes LD1 and LD2 is set closer to the standard light-emission intensity. For example, when the detected light-emission intensity is twice as large as the standard light-emission intensity, the current-magnification setting circuit 17 outputs a twice current as large as the magnification set in advance, as the current magnification (m) to be executed in the current-magnification setting circuit 17.

Along with these processes, in the light detection circuit 103, the quantity of light of the laser beam emitted backward from the semiconductor laser LD including the laser diodes LD1 and LD2 is converted to the current as the monitor current Im in the photoelectric conversion element (photo-receiver element) PD, and the monitor current Im is input to the current-magnification setting circuit 17. Then, the current-magnification setting circuit 17 amplifies the monitor current Im converted by the photoelectric conversion element (photo-receiver element) PD to the magnification determined designated by the current-magnification calculation circuit 104 and then outputs the amplified current as the detection current Idet. The detection current (amplified current) Idet flows through the detection resistor R, which generates a detection voltage Vdet of the light-emission intensity.

Subsequently, the light-quantity control circuit 105 compares the detection voltage Vdet of the light-emission intensity and a setting value (Lset) of the light-emission intensity, and controls respective values of driving currents Iop that control the light emission intensities for the laser diodes LD1 and LD2 in the semiconductor laser LD based on the comparison result.

More specifically, when the detection voltage Vdet of the light-emission intensity is smaller than the setting value Lset of the light-emission intensity, the light-quantity control circuit 105 increases the driving currents Iop of the laser diodes LD1 and LD2 so that the detection voltage Vdet of the light-emission intensity is increased. Conversely, when the detection voltage Vdet of the light-emission intensity is smaller than the setting value Lset of the light-emission intensity, the light-quantity control circuit 105 decreases the driving currents Iop of the laser diodes LD1 and LD2 so that the detection voltage Vdet of the light-emission intensity is decreased. Thus, the driving currents Iop of the laser diodes LD1 and LD2 are controlled such that the driving currents Iop of the laser diodes LD1 and LD2 become the intensities corresponding to the setting values Lset of the light-emission intensity. The setting value Lset of the light-emission intensity may be set based on a sheet size, color or monochrome printing.

(First Embodiment)

Next, a detail description of the laser driver 100 including above-described operation is described below with reference to FIGS. 5 through 8

Figure 5:
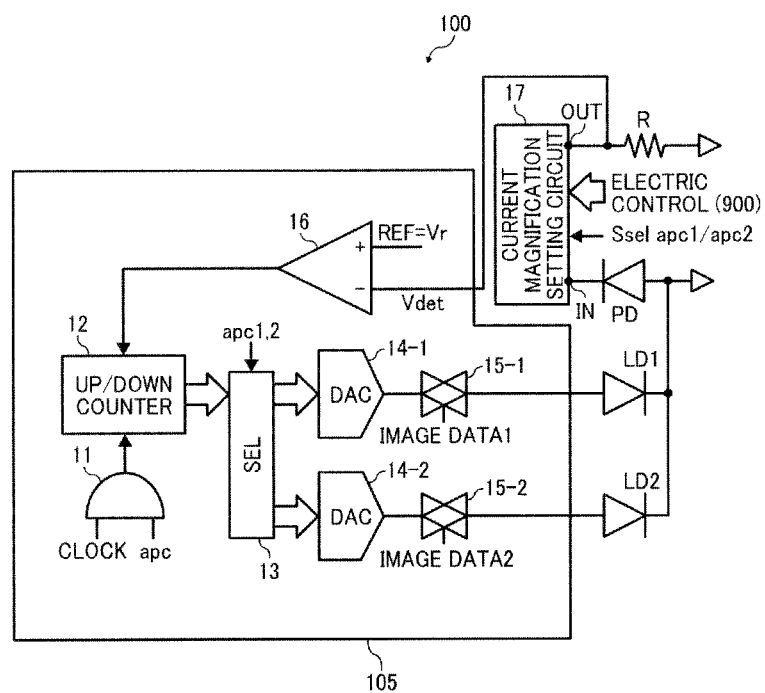
FIG. 5 is circuitry of a light-quantity control circuit in the laser driver shown in FIG. 4.
Figure 6:
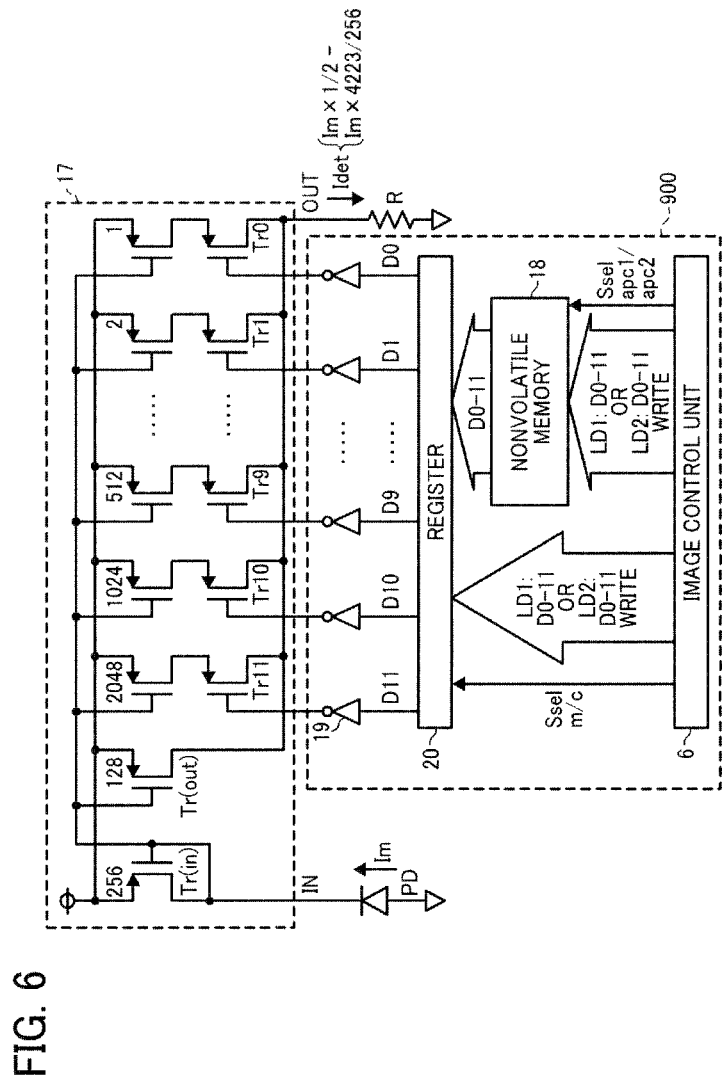
FIG. 6 is circuitry illustrating vicinity of a current-magnification setting circuit in the laser driver shown in FIG. 4.

FIG. 5 is a detail circuitry of the light-quantity control circuit 105 in the laser driver 100. FIG. 6 is an expanded diagram illustrating vicinity of the current-magnification setting circuit 17 in the laser driver 100. As shown in FIGS. 5 and 6, the laser driver 100 further includes an AND gate 11, an up/down counter 12, a selector 13, and two digital-analog converters (DAC) 14-1 and 14-2, switches 15-1 and 15-2, a comparator 16, a nonvolatile memory 18, multiple NOT gates 19, and a register 20.

The anode of the photo-receiver element (photodiode) PD is connected to a voltage that has lower voltage and the cathode thereof is connected to an input terminal IN of the current-magnification setting circuit 17.

Figure 2:
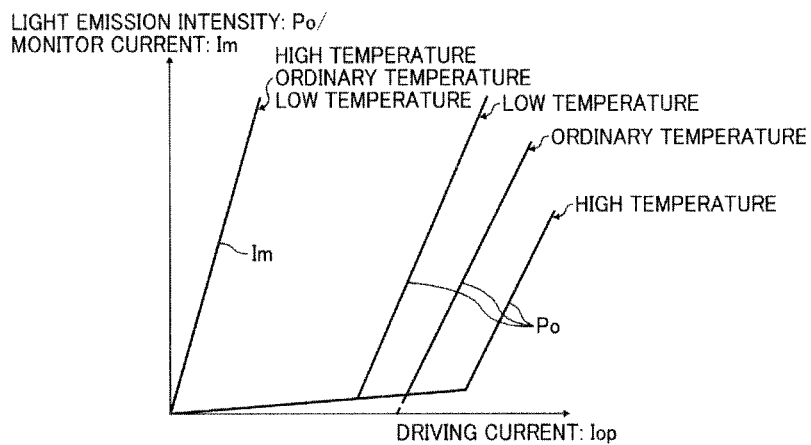
FIG. 2 is a diagram illustrating a light-current feature curve between a current-light feature of light-emission intensities of a laser and a light-current feature of a monitor current of the laser.

An apc signal that is a part of the APC timing signal Sapcsh (see FIG. 2) generated in the image control unit 6 and a clock signal are input to the AND gate 11. The AND gate 11 enables the clock signal (outputs a predetermined signal) only when the apc signal input to the AND gate 11 is high (High). It is to be noted that the light-quantity control circuit 105 may not include the AND gate 11 and the apc signal input to the AND gate 11, and in this case, the clock signal is directly input to the up/down counter 12.

The comparator 16 compares the detection voltage Vdet and a reference voltage Vref. The comparator 16 outputs a high signal when the detection voltage Vdet is higher than the reference voltage Vref and outputs a low signal when the detection voltage Vdet is lower than the reference voltage Vref. In a case in which the up/down counter 12 receives the predetermined signal from the AND gate 11, the up/down counter 12 outputs a signal to turn a counting counter to down when the low signal is input from the comparator 16 and outputs a signal to turn the counter up when the high signal is input from the comparator 16.

The selector 13 selectively outputs the signal from the up/down counter 12 to either the DA converter 14-1 or 14-2 based on input apc1, apc2 signals (selection signal Ssel apc1/apc2). More specifically, when the apc1 signal is high, the selector 13 outputs setting data D0 through D9 for the laser diode LD1 to the D/A converter 14-1. When the apc2 signal is high, the selector 13 outputs setting data D0 through D9 for the laser diode LD2 to the D/A converter 14-2.

The each D/A converter 14 converts an output signal from the up/down counter 12 from digital to analog and outputs a converted analog signal. Each switch 15-1 and 15-2 switches the converted analog signal from the D/A converter 14-1 and 14-2 in accordance with input image data 1 and 2 and outputs a switched signal to the corresponding laser diodes LD1 and LD2.

In FIG. 6, the current-magnification setting circuit 17 is constructed by multiple current mirror circuits including multiple positive channel metal-oxide semiconductor field-effect transistors (MOS FET). The current mirror circuit can generate a current determined by a channel length (L) and width (W) of transistors (Tr).

The current-magnification setting circuit 17 is electrically controlled by an electric control unit 900 including the image control unit 6, the nonvolatile memory 18. the register 20, and the NOT gates 21.

The register 20 stores data D0 through D11 based on signals indicating the setting value of the data D0 through D11 with respect to each of the laser diodes LD1 and LD2 from the image control unit 6 and a selection signal Ssel m/c for selecting the nonvolatile memory 18 and the image control unit 6. Alternatively, the register 20 stores the data D0 through D11 based on signals of setting value of the data D0 through D11 by laser diodes LD1 and LD2 from the nonvolatile memory 18 and the selection signal Ssel m/c. The data D0 through D11 is set for controlling the transistors TR0 through TR11 that construct the current mirror circuits in the current-magnification setting circuit 17 to switch ON and OFF.

By the signal Ssel apc1/apc2, when the apc1 signal is high, the setting data D0 through D9 for the laser diode LD1 is output to the nonvolatile memory 18 or the register 19, and, when the apc2 signal is high, the setting data D0 through D9 for the laser diode LD1 is output to the nonvolatile memory 18 or the register 19.

The nonvolatile memory 18 stores the setting value of the data D0 through D1, indicated by the signals from the image control unit 6, separately for each of the laser diodes LD1 and LD2. That is, the nonvolatile memory stores the multiple different predetermined magnifications.

Since the transistors Tr0 through Tr11 in the current-magnification setting circuit 17 are turned ON and OFF based on the data (signals) D0 through D11 input from the register 18 via the corresponding NOT gates 19, and the current-magnification setting circuit 17 outputs a current as the detection current Idet, determined by summing up the conductive currents of the on-controlled transistors due to the control based on the data D0 through D11, which are described further detail later.

The transistor channel ratio (Tr ratio W/L) of a transistor Tr(in) that receives the monitor current Im input from the photo-receiver element PD through the input terminal IN is set "256", and the transistor channel ratio (Tr ratio W/L) of a transistor Tr(out) constantly outputs is set "128". The transistor channel ratio (Tr ratio W/L) of the pairs of transistors Tr0 through Tr11 connected to the corresponding the data D0 through D11 are set "1, 2, 4, 8, 16, 32, 64, 128, 256, 512, 1024, 2048" respectively.

The output current (detection current) Idet of the current-magnification setting circuit 17 is a value that the monitor current Im multiplied by magnification. (Im×magnification). The magnification may be set within a range for example, 0.5 through 16.496. Below TABLE1 shows examples of magnifications maximum two numbers and minimum two numbers.

TABLE 1

| D11 to D1 | MAGNIFICATION |
|---|---|
| 0000000000000000 | 128/256 = 0.5 |
| 0000000000000001 | 129/256 = 0.5039 |
| 1111111111111110 | 4222/256 = 16.492 |
| 1111111111111111 | 4223/256 = 16.496 |

The most coarse interval between the adjacent numbers is the condition in which the magnification is minimum, that is, 1/128=0.78%. The finest interval between the adjacent numbers is the condition in which the magnification is maximum, that is, 1/4223=0.02%. The semiconductor laser LD is controlled so that the light-emission intensity becomes a value corresponding the monitor current Im, and this interval means a setting accuracy (interval) of the light-emission intensity in the semiconductor laser LD.

Next, a setting method of the current magnification in the current-magnification setting circuit 17 according to the present embodiment.

In a case in which the multi-beam laser emits, even when the powers of front projecting power are identical, the generated monitor currents Im are slightly different among the respective beams due to individual variability. In addition, even when the quantities of light generated in the multiple beams are identical, the power on the photoreceptor 4 becomes different due to difference of the transmittance and reflectance of the lenses Similarly, in a multicolor image forming apparatus, the receptive colors on the photoreceptors 4 are assigned to multiple laser beams generated in the multiple lasers, and power for requiring the color on the photoreceptor 4 is separately. Accordingly, the monitor currents Im of the laser diodes LD1 and LD2 for setting to predetermined light emission intensities are different.

For example, in a case in which the setting value of the light-emission intensity is 1V, and a resistance value of the detection resistor R connected to an output terminal OUT of the current-magnification setting circuit 17 is 1 kΩ, the output current Idet of the current magnification set circuit 17 is 1 mA (1 V/1 kΩ=1 mA), and accordingly the light-emission intensity corresponding the setting value Lset of the light-emission intensity can become a predetermined value.

In this case, when the monitor current Im required for the laser diode LD1 is 2 mA (Im=2 mA), by setting the data D11 through D0 to "00000000000" (magnification=128/256=0.5), the output current Idet flowing to the detection resistor R becomes 1 mA because the monitor current Im=2 mA is multiplied by 0.5 (2 mA×0.5=1 mA). Alternatively, when the monitor current Im required for the laser diode LD2 is 0.6062 mA (Im=0.06062 mA), by setting data D11 through D0 as "11111111111" (magnification=4223/256=16.496), the output current Idet flowing to the detection resistor R becomes 1mA because the monitor current Im=0.06062 mA is multiplied by 16.496 (0.06062 mA×16.496). Thus, a desired light-emission intensity can be obtained.

Herein, an adjusting method of an output current in a comparative example of the laser driver 100× (see FIG. 7) for control multi-laser, including multiple variable resistors VR1 and VR2. When the setting value Lset of the light-emission intensity is determined by subtracting 1V from a power voltage Vdd, (Lset=Vdd−1V), the semiconductor laser driver 7 is controlled such that voltage drop caused by the variable resistors VR1 and VR2 is set 1 V. When 2 mA of the monitor current Im for the laser diode LD2 is required, by adjusting the variable resistor VR1 corresponding the laser diode LD1 is set 0.5 kΩ (1 V/2 mA=0.5 kΩ), the predetermined light-emission intensity can be obtained. Alternatively, when 0.006062 mA of the current Im for the laser diode LD2 is required, by adjusting the variable resistor VR1 corresponding the laser diode LD1 so that the resistance value of the variable resistor VR is set to 16.496 kΩ (1V/0.06062 mA=16.496 kΩ), the predetermined light-emission intensity can be obtained As described above, although there is a need for the adjusting the variable resistors VR1 and VR2 by manually in the comparative example, in the laser driver 100 according to the present embodiment, manual adjustment of the variable resistors VR1 and VR2 is not required.

Herein, in the image forming apparatus 200 shown in FIG. 3, the optical unit, such as, the laser driver 100, the laser unit 1, the polygon mirror 2, and the scanning lenses 3 are configured as a laser scan unit (hereinafter "LSU"). In order to activate the semiconductor laser LD rapidly, the laser driver 100 and the laser unit 1 are provided in a same LD board and disposed close to each other. It is preferable that the LD board is small so that the LD board is fit into gaps among the LSU.

Next, processes of writing the data D0 though D11 to the register 20 is described below.

(Basic Operation Procedures)

After power-on-reset state during which the power starts up is released, initially, the value in the nonvolatile memory 18 is written to the register 20. After that, the values of the data D0 through D11 in the register 20 is changeable by rewriting from the image control unit 6.

(Perquisites)

(1) All default (initial setting data) of the data D0 through D11 in the nonvolatile memory 18 before the data is written to the nonvolatile memory 18 is set "1", that is, "11111111111". In this default setting condition, the current magnification is maximum, and the light-emission intensity is controlled to be minimum when the APC is executed.

(Manufacture Process)

(2) After the power-on-reset state during which the power starts up is released, the value "1" in the nonvolatile memory 18 is written to the register 20. At this time, the register 20 stores the data D0 through D11 for the laser diodes LD1 and LD2 from the nonvolatile memory 18 and the selection signal Ssel m/c that selects the nonvolatile memory 18.

(3) The laser diode LD1 is selected in the writing process.

(4) The data D0 through D11 in the register 20 is changed by the image control unit 6 based on the value in the power meter 102 such that the laser diode LD1 is set to a predetermined light-emission intensity, that is, the data D0 through D11 are customized for the laser diode LD1.

(5) After the data D0 through D11 are determined, the image forming unit 6 writes the customized data D0 through D11 for the laser diode LD2 in the nonvolatile memory 18. At this time, the register 20 stores the data D0 through D11 for the laser diodes LD1 and LD2 from the image control unit 6 and a selection signal Ssel m/c that selects the image control unit 6.

(6) Subsequently, the laser diode LD2 is selected in the writing process.

(7) The data D0 through D11 in the register 20 is changed by the image control unit 6 based on the value in the power meter 102 such that the semiconductor laser LD2 is set to a predetermined light-emission intensity, that is, the data D0 through D11 are customized for the semiconductor laser LD2.

(8) After the data D0 through D11 are determined, the image control unit 6 writes the customized data D0 through D11 for the laser diode LD2 in the nonvolatile memory 18.

(Market)

(9) After the power-on-reset state during which the power starts up is released, the customized value of the customized data D0 through D11 for the corresponding laser diodes LD1 and LD written in the manufacture of the laser driver 100 into the register 20 stored in the nonvolatile memory 18. At this time, the register 20 stores the data D0 through D11 the laser diodes LD1 and LD2 from the nonvolatile memory 19 and the selection signal Ssel m/c that selects the nonvolatile memory 19.

(10) When the APC is executed, current magnification is set for the selected one of the laser diodes LD1 and LD2 based on the apc1/2 selection signal by writing the respective data D0 through D11 in the nonvolatile memory 18 corresponding to the laser diodes LD1 and LD2 separately.

Next, a reason for installation of the nonvolatile memory 18 is described below.

Because the laser unit 1 includes only one photo-receiver element PD in spite that the laser unit 1 includes multiple semiconductor lasers LD (edge-emitting laser) only one photo-receiver element PD, the adjustment of the light-emission intensity is executed one by one beam. Therefore, the laser diodes LD1 and LD2 can be controlled by a common signal current-magnification setting circuit 17.

The image control unit 6 determines which of the laser diodes LD1 and LD2 is the one whose light-emission intensity is adjusted. At this time, the setting value of the current magnification maybe switched between those for the laser diodes LD1 and LD2 as needed. In the manufacture of the laser driver 100, the individual current magnification is determined by the monitor current Im obtained when the light-emission intensity most suitable as a system is obtained separately for each of the semiconductor diode D1 and D2, it is necessary to keep the setting value of the current magnification to these individual current magnifications constantly during the normal operation. In addition, the setting value of the current magnification should be resettable when the power is turned on again after power off, it is a necessary to store the data of the current magnification in the nonvolatile memory 18.

By contrast, in a comparative example (see FIG. 7), there is stored by fixing a rotation axis of the variable resistors VR1 and VR2 by resin.

Below describes a configuration in which the setting value of the current magnifications may be used for not customizing the power on the photoreceptor 4 but for just correcting the sensitivity fluctuation of the monitor current Im corresponding to the front projecting power. In the present embodiment, the laser driver 100 and the laser unit 1 are installed in a common LD board. In a configuration in which the current magnification value (m) is used for only correcting the sensitivity fluctuation of the monitor current Im, and the nonvolatile memory 18 that stores the current magnification value (m) is mounted on the LD board, all users have to do is replace the LD board in the machines, when the semiconductor laser LD is degraded in the market and the semiconductor laser LD cannot emit properly. At this time, one of the magnifications corresponding to the semiconductor laser LD is written to a new LD board.

By contrast, if the nonvolatile memory 18 is installed in a mother board, in a replacement time, it is required to not only replace of the LD board but also to rewrite the magnification data in the nonvolatile memory 18 in the mother board to magnification data of a semiconductor laser LD on a new LD board. In this case, it is required for limitation of space and setting the configuration to be rewritable data of the magnification.

Alternatively, in a configuration in which the setting value of the magnification current is set and the lighting power on the photoreceptor 4 customized, correction is performed with respective to each laser scan unit (LSU), and the nonvolatile memory 18 can be installed wherever in the laser driver 100. In the present embodiment, the nonvolatile memory 18 may be mounted on the LD board.

(Comparison)

Next, comparison between the laser driver 100 according to the present embodiment and a laser driver according to a comparative example.

Figure 7:
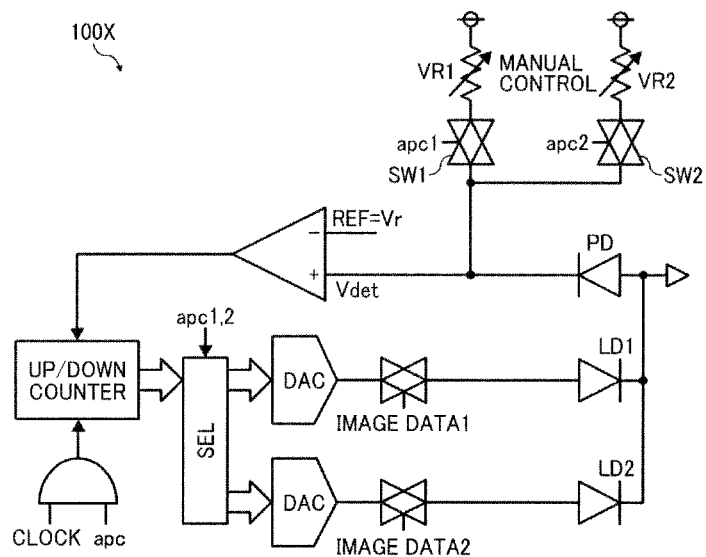
FIG. 7 illustrates circuitry of a laser driver according to a comparative example.
Figure 8:
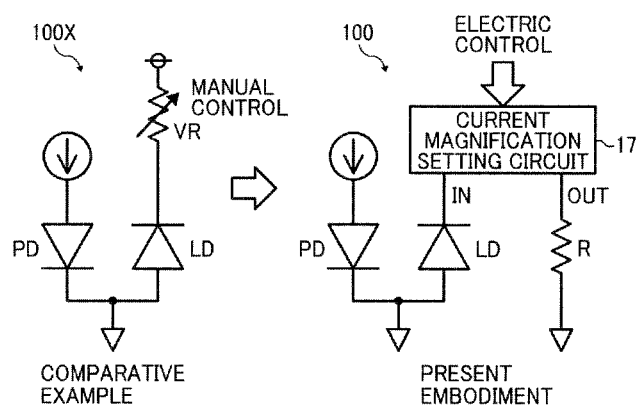
FIG. 8 is an explanation diagram illustrating a difference between the laser diode according to the present embodiment shown in FIG. 4 and the laser driver according to the comparative example shown in FIG. 7.

As a comparison, FIG. 7 illustrates circuitry of a laser driver 100X according to a comparative example (related art). The laser driver 100X according to the comparative example includes variable resistors VR1 and VR2 and switches SW1 and SW2 that switch conductive currents flowing to the variable resistors VR1 and VR2 based on the APC1 APC2 signals, instead of the current-magnification setting circuit 17. FIG. 8 is an explanation diagram illustrating differences between the laser driver 100 according to the present embodiment shown in FIG. 4 and the laser driver 100X according to the comparative example shown in FIG. 7. Herein, the variable resistor VR1 and VR2 are big formation so as to change the resistance value by rotating manually. Especially, when the multi-beam is used to improve the resolution and speed, it is necessary to install multiple variable resistors on the LD board. Thus, the size of the variable resistors prevents the LD board from being made more compact.

Further, since the number of the adjustment of the variable resistors in the adjusting process in a case in which the multicolor image forming apparatus including the multi-beam laser diode, which causes the cost to increase and the adjusting process to become complex. For example, when the laser diodes are constructed of resistive four beams for four colors, including yellow(Y), magenta (M), cyan(C), and black (K), sixteen (4 colors×4 beams=16 times) adjustment processes are required, and sixteen variable resistors are required for installing on the LD board.

Therefore, although the LD board is required for large space to ensure an adjusting space for the variable resistors VR1 and VR2 in the comparative example, in the present embodiment, the LD board includes the current-magnification setting circuit 17 instead of the switches SW1 and SW2 and the variable resistors VR1 and VR2, and thus, the LD board can become compact.

As described above, in the present embodiment, the monitor current Im from the photo-receiver element PD can be finely set to multiple magnifications separately for each the multiple semiconductor lasers LD. Accordingly, although the variable resistors (VR1 or VR2) that is required in the comparative example, only one fixed resistor R can be required in the semiconductor laser driver 100 in the present embodiment. Thus, the barrier presented by the variable resistors VR1 and VR2 heretofore to making the LD board more compact, and the LD board cost that is dependent on the variable resistors VR1 and VR2 whose cost is changed in the market, can be solved.

In addition, in manufacture of the printer, in a prior art, although the human adjusts the light-emission intensity while changing resistance values Rvr of the variable resistors VR1 and VR2 manually, by contrast, in the present embodiment, the magnification of the monitor current Im can be changed by electronic signal. Accordingly, the setting value of the current magnification can be calculated by the value in the power meter 102, automatically. Therefore, adjusting the light-emission intensity can be executed full automatically, which prevents manufacturing cost from increasing and adjusting process from complicating. Further setting error of the light-emission intensity caused by the fluctuation from the manual operation of the operator can be prevented.

In the present embodiment, since the current-magnification setting circuit 17 is constructed of the multiple current mirror circuit, the imperceptible monitor current Im detected by the photo-receiver element PD can be amplified with high degree of accuracy.

Further, in the semiconductor laser driver 100 according to the present embodiment, the nonvolatile memory 18 stores the multiple different predetermined magnifications to be set in the current-magnification setting circuit 17, and the current-magnification setting circuit 17 amplifies the monitor current Im from the photo-receiver element PD based on one of the multiple predetermined magnifications stored in the nonvolatile memory 18. With this configuration, the setting value of light-emission intensity is not changed with time, differently from the variable resistors VR1 and VR2.

When the multiple semiconductor lasers LD are provided in the semiconductor laser driver 100, the current-magnification setting circuit 17 can set to predetermined magnifications separately for each semiconductor laser LD. Although the driving current Iop and the characteristics of the light-emission intensities vary among the respective semiconductor laser because these characteristics are unique to each semiconductor laser, in the present embodiment, the semiconductor lasers LD can be properly controlled separately.

The current-magnification setting circuit 17 and the light-quantity control circuit 105 including the AND gate 11, the up/down counter 12, the selector 13, the DA converters 14, the switches 15, and the comparator 16, may be integrated onto one chip integrated circuit (IC). With this configuration, the semiconductor laser driver 100 can become compact.

(Second Embodiment)

Next, a second embodiment is described below with reference FIG. 9.

Figure 9:
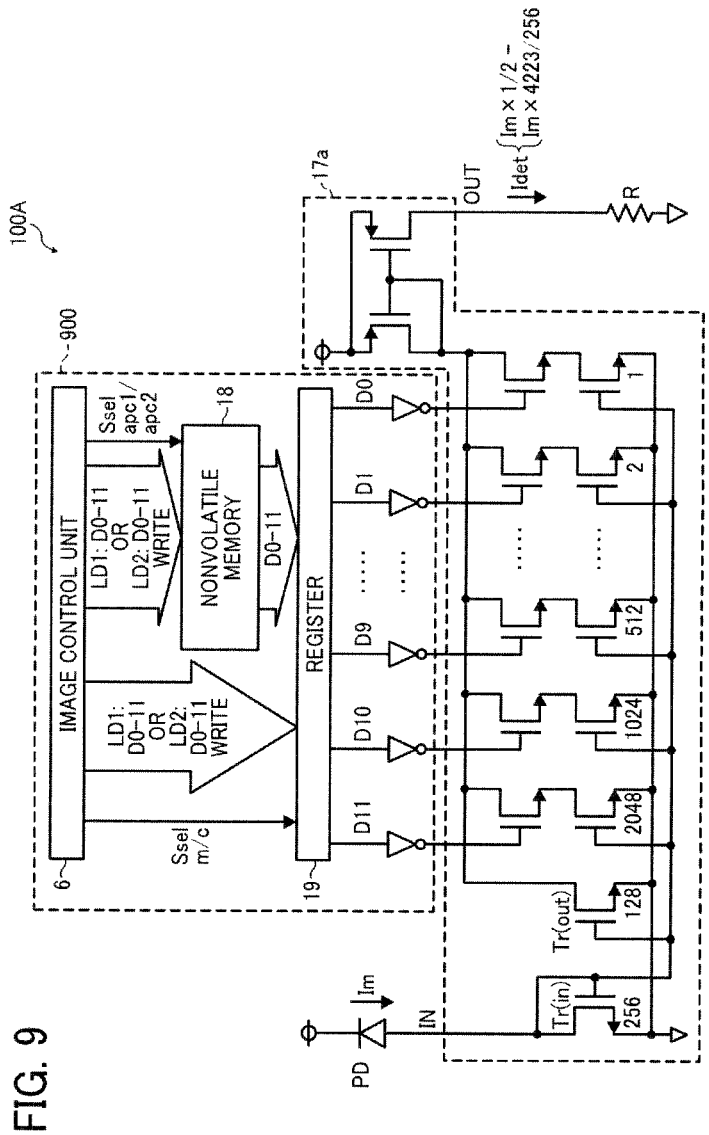
FIG. 9 is circuitry illustrating vicinity of a current-magnification setting circuit in a laser driver according to a second embodiment.

FIG. 9 is circuitry illustrating vicinity of a current-magnification setting circuit 17a in a semiconductor laser driver 100A according to a second embodiment. The circuit configuration is almost similar to the circuit shown in FIGS. 4 and 5, however, in the semiconductor laser driver 100A, the photo-receiver element PD is connected to a voltage whose cathode is high, and anode thereof is connected to the input terminal IN of the current-magnification setting circuit 17a. In addition, the current-magnification setting circuit 17a is constructed of a current mirror circuit including multiple negative-channel Nch FET and current mirror circuit including multiple Pch FET. As described above, the semiconductor laser drivers 100A is similar to the semiconductor laser driver 100 shown in FIG. 4, and therefore, the configuration of the second embodiment can achieve effects similar to those of the semiconductor laser driver 100 as described above.

The first and second embodiment can be adapted the variation of light-quantity control circuits 105b and 105c in the semiconductor laser driver 100A described below.

(Variation)

Figure 10:
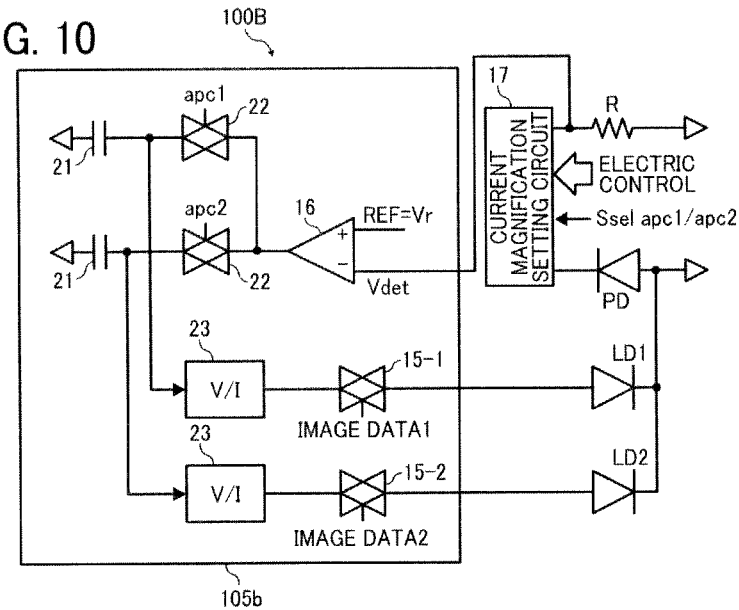
FIG. 10 is circuitry of a light-quantity control circuit in a laser driver shown according to a variation of the light-quantity control circuit shown in FIG. 5.

Next, a variation of the semiconductor driver is described below with reference FIG. 10.

Figure 11:
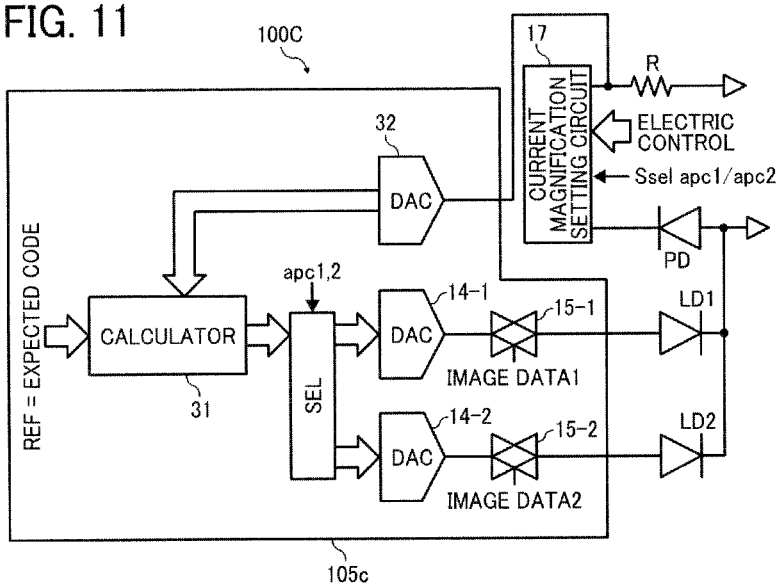
FIG. 11 is circuitry of a light-quantity control circuit in a laser driver shown according to another variation of the light-quantity control circuit shown in FIG. 5.

FIG. 11 illustrates circuitry of a light-quality control circuit 105b in a semiconductor laser driver 100B according to a variation of the semiconductor laser driver 100 shown in FIG. 5. The light-quantity control circuit 105b includes two capacitors 21, two switches 22, and two voltage-current converters 23 instead of the AND gate 11, the up/down counter 12, the selector 13, and the DA converters 14. An output signal from the comparator 16 is executed under "a sample and hold state" by using the capacitors 21 and the switches 22, that is, the output signal is taken (contained) in the capacitors 21 as a sample, and the voltage of the sample is held by the switches 23. Then, the laser diodes LD1 and LD2 are controlled based on a current (result) converted from the value of sample-hold voltage in the voltage-current converter 23.

(Another Variation)

Next, a variation of the semiconductor device is described below with reference FIG. 11.

FIG. 11 illustrates circuitry of a light-quality control circuit 105c in a semiconductor laser driver 100C according to a variation of the semiconductor laser driver 100 shown in FIG. 5. The light-quantity control circuit 105c includes a calculator 31 and analog-digital A-D converter 32, instead of the AND gate 11, the up/down counter 12, the selector 13, and the DA converter 14. The A/D converter (ADC) 32 converts a voltage of the resistor R into a digital code, and the calculator 32 compares the digital code and an expected code (REF). Then, the laser diodes LD1 and LD2 are controlled based on a comparison result outputted from the calculator 31.

As described above, the semiconductor laser drivers 100B and 100C are similar to the semiconductor driver shown in FIG. 4, and therefore, the configuration of these variations can achieve effects similar to those of the semiconductor laser driver 100 and 100A as described above.

Although each the semiconductor laser driver shown in FIGS. 4 through 11 includes two laser diodes LD1 and LD2 and one photo-receiver element PD, the laser driver can adopt four laser diodes LD1, LD2, LD3, and LD4, and one photo-receiver element PD. In this case, the laser diodes LD1 and LD2 are changed to the four laser diodes LD1, LD2, LD3, and LD4, and selection of apc1 apc2 are increased to four apc1 apc2apc3 and apc3

In addition, in a case in which the semiconductor device described above can also adopt two semiconductor lasers 2 and photo-receiver element PD, when two photo-receiver elements PD are capable operating APC independently, the circuit according to the present embodiment can be set two independently.

Further, the laser driver according to the present embodiments can also control the light-emission intensity not based on the monitor current Im from the photo-receiver element PD installed in interior of the laser unit 1 but based on a current detected by a photo-receiver element PD provided outside of the laser unit 1.

Numerous additional modifications and variations are possible in light of the above teachings. It is therefore to be understood that, within the scope of the appended claims, the disclosure of this patent specification may be practiced otherwise than as specifically described herein.

This patent specification claims priority from Japanese Patent Applications No. 2010-048154, filed on Mar. 4, 2010 in the Japan Patent Office, which is hereby incorporated by reference herein in its entirety.

What is claimed is:

1. A semiconductor laser driver to drive at least one semiconductor laser, the semiconductor laser comprising:
   a control circuit to control a light emission intensity for the semiconductor laser based on a detected light emission intensity and on a predetermined light emission intensity setting value;
   a nonvolatile memory to store the multiple different predetermined magnifications, wherein the current magnification setting circuit amplifies the monitor current output from the photoelectric conversion element to the amplified current based on one of the multiple different predetermined magnifications stored in the nonvolatile memory; and
   a light detection circuit to detect a quantity of light emitted from the semiconductor laser as the detected light emission intensity and output the detected light emission intensity to the control circuit,
   the light detection circuit comprising:
      a photoelectric conversion element to convert the quantity of light emitted from the semiconductor laser into an electrical current and output the converted electrical current as a monitor current;
      a current magnification setting circuit to amplify the monitor current output from the photoelectric conversion element to a predetermined amplified current at one of multiple different predetermined magnifications; and
      a detection resistor to convert the amplified current output from the current magnification setting circuit into a voltage and output the voltage as the detected light emission intensity.

2. The semiconductor laser driver according to claim 1, wherein the current magnification setting circuit comprises multiple current mirror circuits.

3. The semiconductor laser driver according to claim 1, wherein the current magnification setting circuit sets one of the multiple different predetermined magnifications separately for each semiconductor laser.

4. The semiconductor laser driver according to claim 1, wherein the current magnification setting circuit and the control circuit are integrated onto a single integrated circuit (IC).

5. An image forming apparatus, comprising at least one semiconductor laser to emit light;
   an image control unit to generate image data and an automatic power control signal to obtain a predetermined light emission intensity of light for the semiconductor laser;
   a semiconductor laser driver to drive the semiconductor laser and receive the image data and the automatic power control signal output from the image control unit;
   the semiconductor laser comprising:
      a control circuit to control a light emission intensity of the semiconductor laser based on light emission intensity and on a predetermined light emission intensity setting value;
      a nonvolatile memory to store the multiple different predetermined magnifications, and the current magnification setting circuit amplifies the monitor current output from the photoelectric conversion element to the amplified current based on one of the multiple different predetermined magnifications stored in the nonvolatile memory; and
      a light detection circuit to detect a quantity of light emitted from the semiconductor laser as the detected light emission intensity and output the detected light emission intensity to the control circuit,
      the light detection circuit comprising:
         a photoelectric conversion element to convert the quantity of light emitted from the semiconductor laser into an electrical current and output the electrical current as a monitor current;
         a current magnification setting circuit to amplify the monitor current output from the photoelectric conversion element into a predetermined amplified current at one of multiple different predetermined magnifications; and
         a detection resistor to convert the amplified current output from the current magnification circuit into a voltage and output the voltage as the detected light emission intensity.

6. The image forming apparatus according to claim 5, wherein the current magnification setting circuit of the semiconductor laser driver comprises multiple current mirror circuits.

7. The image forming apparatus according to claim 5, comprising multiple semiconductor lasers,
   wherein the current magnification setting circuit of the semiconductor laser driver sets one of the multiple different predetermined magnifications separately for each semiconductor laser.

8. The image forming apparatus according to claim 5, wherein the current magnification setting circuit and the control circuit are integrated onto a single integrated circuit (IC).

* * * * *